(12) United States Patent
Tsuruta

(10) Patent No.: US 6,315,540 B1
(45) Date of Patent: Nov. 13, 2001

(54) MOLDING DIE FOR CONCURRENTLY MOLDING SEMICONDUCTOR CHIPS WITHOUT VOIDS AND WIRE WEEP

(75) Inventor: Hisayuki Tsuruta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/680,915

(22) Filed: Oct. 6, 2000

Related U.S. Application Data

(63) Continuation of application No. 09/337,609, filed on Jun. 21, 1999, now Pat. No. 6,200,121.

(30) Foreign Application Priority Data

Jun. 25, 1998 (JP) .................................................. 10-179179

(51) Int. Cl.⁷ .............................. H01L 21/56; B29L 45/14
(52) U.S. Cl. ............... 425/123; 264/272.14; 264/272.17; 425/127; 425/129.1; 425/215; 425/544; 425/120; 438/127
(58) Field of Search ........................ 264/272.14, 272.15, 264/272.17; 425/116, 117, 120, 123, 127, 129.1, 544, 215; 438/127

(56) References Cited

U.S. PATENT DOCUMENTS

| | | | | |
|---|---|---|---|---|
| 5,204,122 | * | 4/1993 | Konishi ................................ | 425/116 |
| 5,460,502 | * | 10/1995 | Majercak .............................. | 425/116 |
| 5,461,256 | * | 10/1995 | Yamada et al. ....................... | 257/679 |
| 5,834,035 | * | 11/1998 | Osada et al. .......................... | 425/116 |
| 5,886,398 | * | 3/1999 | Low et al. ............................. | 257/667 |
| 6,019,588 | * | 2/2000 | Peters et al. .......................... | 425/125 |
| 6,033,202 | * | 3/2000 | Bao et al. .............................. | 425/117 |
| 6,087,202 | * | 7/2000 | Exposito et al. ...................... | 438/127 |
| 6,173,490 | * | 1/2001 | Lee et al. .............................. | 425/544 |
| 6,245,595 | * | 6/2001 | Nguyen et al. ....................... | 438/127 |

FOREIGN PATENT DOCUMENTS

| | | | |
|---|---|---|---|
| 458577-A1 | * | 5/1991 | (EP) . |
| 2-203544-A | * | 8/1990 | (JP) . |
| 3-290217-A | * | 12/1991 | (JP) . |
| 4-132234-A | * | 5/1992 | (JP) . |
| 6-244313-A | * | 9/1994 | (JP) . |
| 7-164473-A | * | 6/1995 | (JP) . |
| 8-139218-A | * | 5/1996 | (JP) . |
| 8-241901-A | * | 9/1996 | (JP) . |
| 8-264577-A | * | 10/1996 | (JP) . |
| 9-36155-A | * | 2/1997 | (JP) . |
| 9-181107-A | * | 7/1997 | (JP) . |
| 252065-A | * | 9/1997 | (JP) . |

* cited by examiner

*Primary Examiner*—Robert Davis
(74) *Attorney, Agent, or Firm*—Hutchins, Wheeler & Dittmar

(57) ABSTRACT

A molding die used for concurrently packaging semiconductor chips in a large piece of synthetic resin has a cavity rectangular in cross section and having two long peripheral lines and two short peripheral lines for accommodating a circuit panel where the semiconductor chips are mounted, melted synthetic resin is supplied through a gate extending along one of the long peripheral lines to the cavity so that the melted synthetic resin smoothly flows over the cavity, and the smooth flow prevents the molded product from voids and a wire weep.

20 Claims, 5 Drawing Sheets

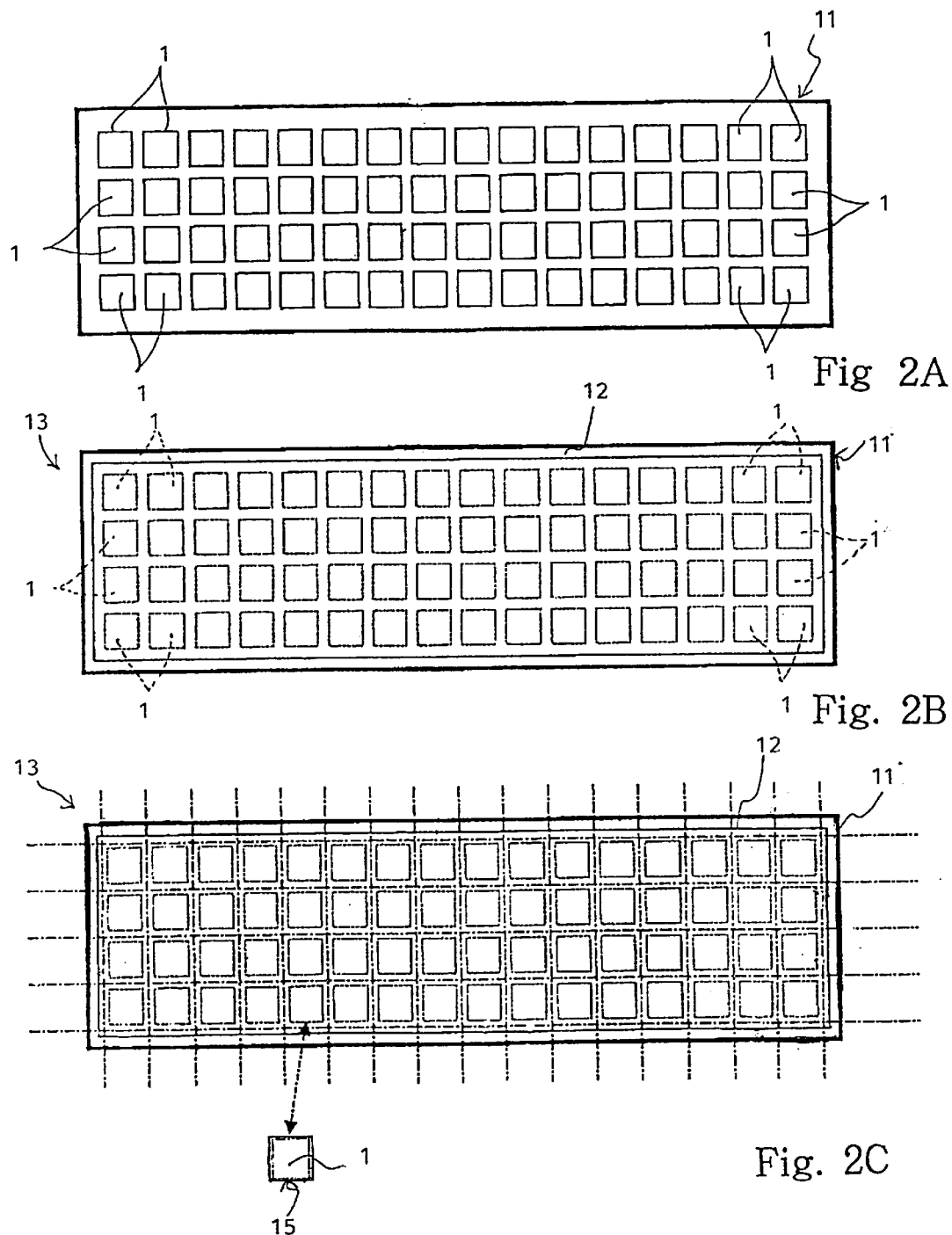

MOLDING DIE FOR CONCURRENTLY MOLDING SEMICONDUCTOR CHIPS WITHOUT VOIDS AND WIRE WEEP

CROSS REFERENCE TO RELATED APPLICATIONS

This application is a continuation of U.S. patent application Ser. No. 09/337,609 filed on Jun. 21, 1999 and now U.S. Pat. No. 6,200,121.

FIELD OF THE INVENTION

This invention relates to a packaging technology and, more particularly, to a process for molding semiconductor chips and a molding die used therein.

DESCRIPTION OF THE RELATED ART

Various kinds of package are used for semiconductor devices. A tape ball grid array package, a plastic ball grid array package, a fine pitch ball grid array package and a chip size package are examples of the known package. A surface-mounting package such as the plastic ball grid array package and the chip size package has a ball grid array directly connected to a circuit board, and is appropriate for miniature electric products.

A typical example of the packaging process is disclosed in Japanese Patent Publication of Unexamined Application No. 9-252065. The prior art packaging process starts with preparation of a printed circuit panel. A conductive pattern was printed on an insulating plate of glass fiber reinforced epoxy resin or polyimide, and the conductive pattern and the insulating plate as a whole constitute the printed circuit panel.

The printed circuit panel is placed on a die. A punch is pressed against the printed circuit panel, and cuts a circuit frame from the printed circuit panel. The punch is spaced from the circuit frame, and a scrap is left on the die. The circuit frame is upwardly pushed back, and returns into the hollow space formed in the scrap. The circuit frame is snugly received in the scrap, and does not drop out from the scrap. However, a suitable temporary fastening means may be formed in the scrap.

Subsequently, the semiconductor chip is bonded to the circuit frame pushed back into the scrap, and the conductive wires electrically connect the bonding pads on the semiconductor chip to the conductive pattern of the circuit frame. After the wire bonding, the semiconductor chip bonded to the circuit frame is placed in a cavity formed in a molding die, and melted synthetic resin is introduced into the cavity. The synthetic resin is solidified, and the semiconductor chip is sealed in the plastic package.

The solder balls are formed on the reverse surface of the circuit frame, and the prior art semiconductor device is completed. Upon completion, the semiconductor device is separated from the scrap. Thus, the semiconductor chip is mounted on the circuit frame temporarily fastened to the scrap, and the semiconductor device is separated from the scrap after the molding.

Another prior art process is disclosed in Japanese Patent Publication of Unexamined Application No. 9-36155. According to the prior art packaging technology disclosed in the Japanese Patent Publication of Unexamined Application, plural semiconductor chips are mounted on a printed circuit panel at intervals, and frames are fixed to the printed circuit panel in such a manner as to surround the semiconductor chips respectively. The printed circuit panel is cut into substrates where the semiconductor chips are respectively mounted. The semiconductor chip mounted on the substrate is located inside the frame, and the peripheral area of the substrate is outside the frame. The substrate is clamped between an upper die and a lower die, and the frame, the upper die and the lower die define a cavity in the molding die. A gate is formed at a corner of the cavity or a mid point of an edge defining a part of the cavity. Melted synthetic resin is introduced through the gate and the frame into the cavity, and is solidified. As a result, the semiconductor chip is sealed in the molding material.

Yet another prior art process is disclosed in Japanese Patent Publication of Unexamined Application No. 6-244313. The prior art process disclosed in the Japanese Patent Publication of Unexamined Application is used for an SOJ (Small Outline J-bend) package. According to the prior art technology, scratch lines are formed in a semiconductor wafer, and define semiconductor chips. The semiconductor wafer is bonded to a polyimide tape, and bonding pads on the semiconductor chips are connected through conductive wires to leads on the polyimide tape. The semiconductor chips assembled with the leads are put in a cavity formed in a molding die, and melted synthetic resin is introduced into the cavity. The semiconductor chips are concurrently sealed in a large piece of synthetic resin. Grooves are formed in the large piece of synthetic resin, and are located over the scribe lines. The large piece of synthetic resin is broken into products of a semiconductor device along the grooves.

Each of the prior art processes disclosed in Japanese Patent Publication of Unexamined Application Nos. 9-252065 and 9-36155 have the cutting steps, respectively. The circuit frame is cut from the printed circuit panel by using the punch and the die. When the printed circuit panel is clamped by the die, wide area is consumed, and the clamped area makes the circuit frames widely spaced. For this reason, the manufacturer can not arrange the semiconductor chips on the printed circuit panel at high dense. The other prior art process requires an area occupied by the frames and another area consumed by the punch. Therefore, the manufacturer roughly arranges the semiconductor chips on the panel. The glass fiber reinforced epoxy resin and the polyimide tape are expensive. In fact, the areas occupied by the semiconductor chips are only fifty percent of the total area of the expensive panel. The uneconomical usage of the expensive panel makes the production cost of the semiconductor device high.

On the other hand, a problem is encountered in the prior art process disclosed in Japanese Patent Publication of Unexamined Application No. 6-244313 in the scratch lines on the semiconductor wafer and voids after the molding. It is necessary for the manufacturer to form the scratch lines accurately under the grooves. This means an accurate positioning. If the scratch lines are deviated from the grooves, the semiconductor chips are liable to be damaged in the separation stage. Moreover, the grooves are formed during the molding, and projections are formed in the molding dies. The projections are an obstacle against the melted synthetic resin flowing into the cavity, and the voids are produced in the large piece of synthetic resin due to the non-smooth flow of the melted synthetic resin. The prior art process is used for the SOJ package. It is difficult to use the prior art process for a large-sized package and in a concurrent molding for a large number of semiconductor chips.

Finally, all the prior art processes are used in the packaging for semiconductor chips of a certain size. If the semiconductor chips to be molded are different in size from those usually molded, the manufacturer requires a new molding die. Moreover, the plastic ball grid array package and the chip size package have not been standardized, yet. On the other hand, various integrated circuit devices are to be sealed in those packages. The manufacturer requires different molding dies for those semiconductor integrated circuit devices. The molding dies are expensive, and increase the production cost.

SUMMARY OF THE INVENTION

It is therefore an important object of the present invention to provide a process, which is economical and improves the yield.

It is also an important object of the present invention to provide a molding die, which is used in the process.

Research and development efforts have been made on an economical process by the assignee of the present invention. The economical process had the steps of arranging semiconductor chips on a circuit panel, sealing the semiconductor chips on the circuit panel in a large piece of molding material and cutting the molded product into products of a semiconductor device. However, the assignee noticed that known molding dies were causative of voids and wire weep. The known molding die had a gate opposite to a semiconductor device. When plural gates were formed in a molding die in such a manner as to be opposite to semiconductor chips, respectively, melted synthetic resin tended to flow into the gaps between the semiconductor chips, and did not fill the space over the semiconductor chips. The melted synthetic resin flowing into the gaps was causative of the wire weep and the voids over the semiconductor chips. The present inventor concentrated his efforts on a molding process free from the voids and wire weep and a new structure of a molding die used therein.

To accomplish the object, the present invention proposes to form a gate along a peripheral edge of a cavity.

In accordance with one aspect of the present invention, there is provided a process for producing semiconductor devices comprising the steps of a) preparing a circuit panel having plural conductive patterns formed on an insulating layer and plural semiconductor chips mounted on the circuit panel and electrically connected to the plural conductive patterns, respectively, b) accommodating the semiconductor chips mounted on the circuit panel in a cavity of a molding die having a gate extending along one of peripheral lines defining the cavity, c) supplying melted synthetic resin through the gate into the cavity so as to fill the vacant space of the cavity therewith, d) solidifying the melted synthetic resin so as to seal the semiconductor chips into a large piece of synthetic resin and e) cutting the large piece of synthetic resin in such a manner that the semiconductor chips are sealed in small pieces of synthetic resin, respectively.

In accordance with another aspect of the present invention, there is provided a molding die for packaging semiconductor chips in a piece of synthetic resin, and the molding die comprises a die block defining a cavity having peripheral lines and accommodating the semiconductor chips mounted on a circuit panel and a gate open to the cavity along one of the peripheral lines and connected to a source of melted synthetic resin for supplying the melted synthetic resin into a vacant space of the cavity over the aforesaid one of the peripheral lines.

BRIEF DESCRIPTION OF THE DRAWINGS

The features and advantages of the process and the molding die will be more clearly understood from the following description taken in conjunction with the accompanying drawings in which:

FIGS. 2A to 2C are plane views showing a process for producing a semiconductor device according to the present invention;

DESCRIPTION OF THE PREFERRED EMBODIMENT

Figure 1:
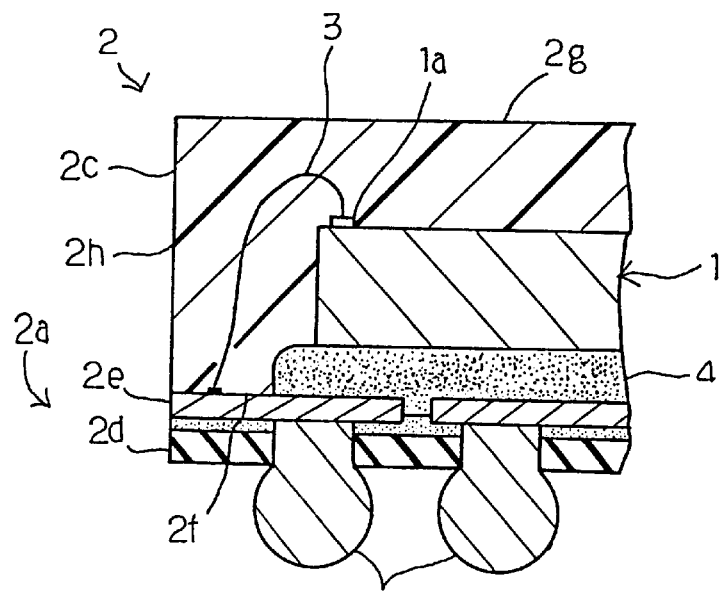
FIG. 1 is a cross sectional view showing the structure of the semiconductor device fabricated through a process according to the present invention.

FIG. 1 illustrates a semiconductor device fabricated through a process embodying the present invention. The semiconductor device largely comprises a semiconductor chip 1, a package 2 and conductive wires 3. Though not shown in FIG. 1, circuit components and wiring lines are incorporated in the semiconductor chip 1, and form an integrated circuit. The integrated circuit is connected to bonding pads 1a, and only one bonding pad 1a is shown in FIG. 1.

The package 2 is broken down into a substrate 2a, ball bumps 2b and a piece of synthetic resin 2c. The synthetic resin is dielectric, and is a kind of thermosetting resin such as, for example, a long gel type thermosetting resin. The substrate 2a includes an insulating tape 2d such as, for example, polyimide and a conductive pattern 2e of copper adhered to the insulating tape 2d. Though-holes are formed in the insulating tape 2d, and the conductive pattern 2e is exposed to the through-holes. The ball bumps 2b pass through the through-holes, and are connected to the conductive pattern 2e. The conductive pattern 2e is connected through the conductive wires 3 to the bonding pads 1a. The semiconductor chip 1 is fixed to the substrate 2 by means of an adhesive compound layer 4.

The piece of synthetic resin 2c has a bottom surface 2f held in contact with the entire exposed surface of the substrate 2a, a top surface 2g extending substantially in parallel to the substrate 2a and side surfaces 2h. The top surface 2g is as wide as the substrate 2a, and, accordingly, the side surfaces 2h are substantially perpendicular to the insulating tape 2d. Thus, the piece of synthetic resin 2c is a rectangular parallelepiped configuration. In this instance, the synthetic resin is a kind of thermosetting resin such as, for example, epoxy. A long-gel type thermosetting resin is desirable.

The piece of synthetic resin of the prior art semiconductor device has a bottom surface wider than the top surface, and the oblique side surfaces consumes a peripheral area around the semiconductor chip. On the other hand, the area occupied by the side surfaces 2h is approximately equal to zero, and the piece of synthetic resin 2c is smaller in volume than the piece of synthetic resin used in the prior art semiconductor device. Though not shown in FIG. 1, an alignment mark is formed on the piece of synthetic resin 2c.

FIGS. 2A to 2C illustrate a process sequence embodying the present invention. The process starts with preparation of a panel 11. The panel 11 is a set of the substrates 2a. The semiconductor chips 1 are bonded to the panel 11, and form an array as shown in FIG. 2A. The gap between the semiconductor chips 1 is narrower than the gap between the semiconductor chips in the prior art semiconductor device. This is because of the fact that an extremely thin rotating disk blade is used as a cutter. The bonding wires 3 are connected to the conductive pattern 2e around each of the semiconductor chips 1. For this reason, the semiconductor chips 1 are spaced to the extent permitting a bonding machine to connect the conductive wires 3 to the conductive patterns 2e and the rotating disk blade to pass between the adjacent conductive patterns 2e.

If the semiconductor device is a facedown type connecting the semiconductor chip 1 to the conductive pattern 2e by means of bumps, the manufacturer makes the gap narrower. The manufacturer makes the gap as narrow as possible in so far as the synthetic resin flows into the gap between the adjacent semiconductor chips 1.

Subsequently, the array of semiconductor chips 1 is sealed in a large piece of the synthetic resin 12, together. A transfer molding may be used for sealing the semiconductor chips 1 in the synthetic resin. Although an extremely narrow peripheral area is remain outside the large piece of synthetic resin 12, the array of semiconductor chips 1 are covered with the large piece of synthetic resin 12, and the panel 11, the semiconductor chips 1 and the large piece of synthetic resin 12 as a whole constitute a package panel 13. The large piece of synthetic resin 12 has a flat top surface.

Solder balls are formed on the reverse surface of the package panel 13, and serve as the ball bumps 2b.

Figure 3:
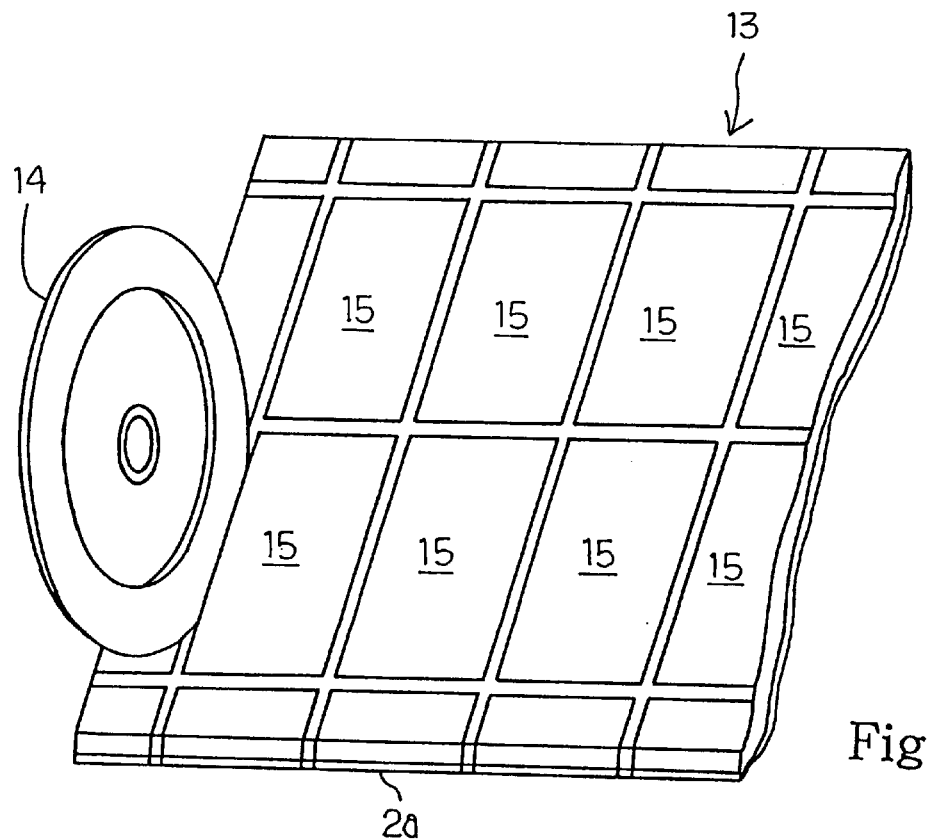
FIG. 3 is a perspective view showing a cutter for separating semiconductor devices from a package panel.

The package panel 13 is placed on a worktable of a dicing machine. The dicing machine is equipped with a rotating disk blade 14 (see FIG. 3), and the package panel 13 are cut into dices 15 along cutting lines indicated by dot-and-dash lines in FIG. 2C. The rotating disk blade 14 is a kind of grinding wheel, and is of the order of 150 microns wide. The rotating disk blade 14 is much narrower than the area consumed by the punch, and scrap is negligible. The dices 15 are individual products of the semiconductor device. Finally, the dices 61 are marked as by step SP4.

While the rotating disk blade 14 is cutting the package panel 13 into the dices 15, cold water is sprayed to the rotating disk blade 14, and flux is washed away from the package panel 13. Thus, the process according to the present invention is simple.

The gap between the semiconductor chips 1 is much narrower than that of the prior art, and, accordingly, the panel is shared between the products of the semiconductor device more than those of the prior art. In fact, although the semiconductor chips are arranged in three rows and eighteen columns on the panel in the prior art, the process according to the present invention allows the manufacturer to arrange the semiconductor chips in five rows and twenty-seven columns on the same panel. The present inventor evaluated the process according to the present invention by using various kinds of semiconductor chips, and confirmed that the semiconductor chips are twice to three times larger in number than those of the prior art. Thus, the process according to the present invention effectively reduces the production cost of the semiconductor device.

Figure 4:
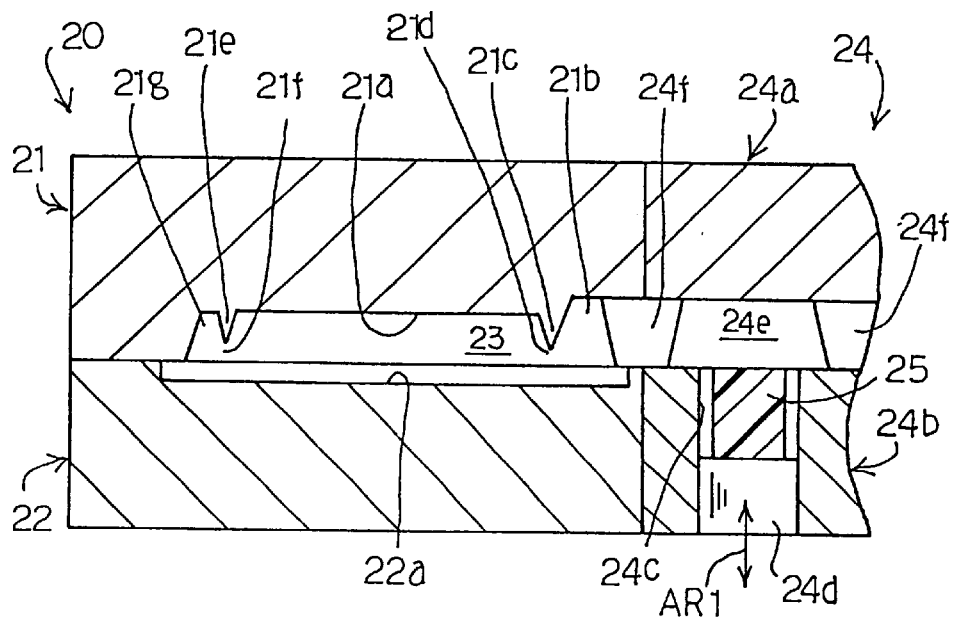
FIG. 4 is a cross sectional view showing the inside of a molding die used in a process according to the present invention.
Figure 5:
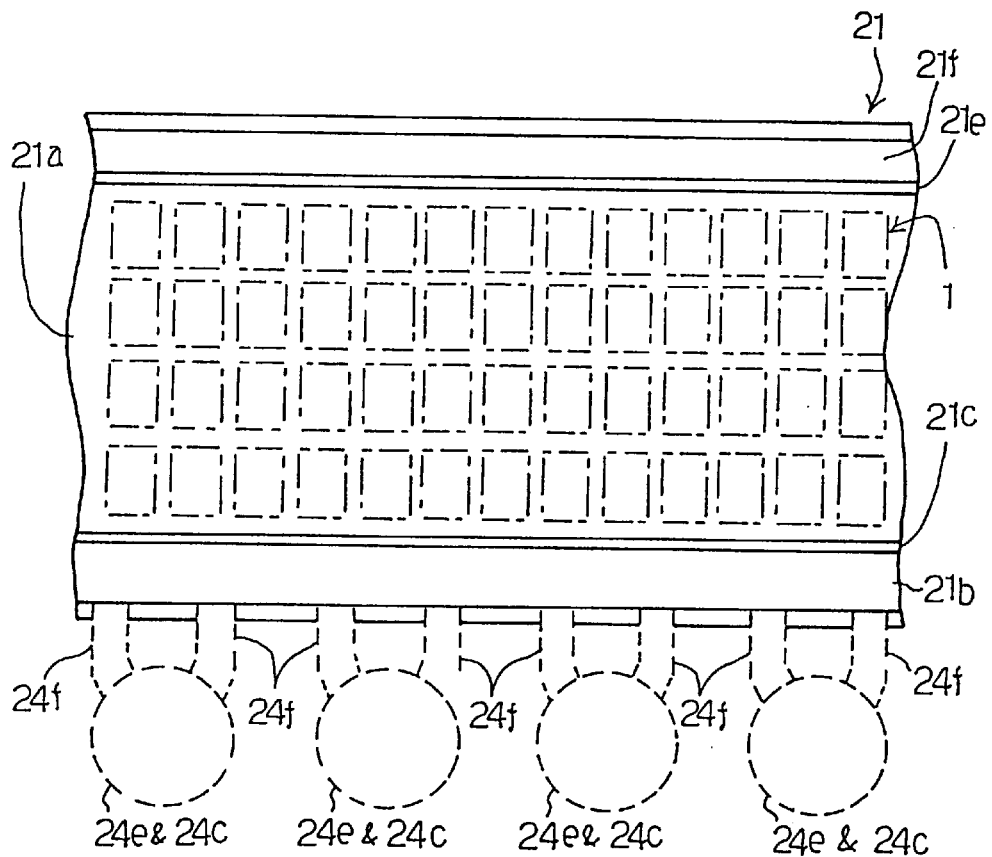
FIG. 5 is a bottom view showing an upper die forming a part of the molding die.

Description is hereinbelow made on a molding die used in the process in detail. FIGS. 4 and 5 show a molding die 20 used in the process described hereinbefore. The molding die 20 has an upper die 21 and a lower die, which is separable from the upper die 21. A recess 21a is formed in the upper die 21, and another recess 22a is formed in the lower die 22. When the upper die 21 and the lower die 22 are assembled together, the recesses 21a/22a form a cavity 23. The semiconductor chips 1 arranged on the panel 13 are accommodated in the cavity 23. The recess 22a is shallow, and the panel 13 is received in the recess 22a. On the other hand, the recess 21a formed in the upper die 21 is deep, and the semiconductor chips 1 are covered with the large piece of synthetic resin 2c in the deep recess 21a.

A gate 21b is further formed in the upper die 21, and a projection 21c separates the gate 21b from the recess 21a. The projection 21c is elongated along one of the side edges of the cavity 23. The side edges of the cavity 23 are longer than the end edges thereof. The projection 21c forms a narrow gap 21d over the panel received in the recess 22a, and the gate 21b is connected through the narrow gap 21d to the cavity 23. The gate 21b also extends along the side edge of the cavity 23, and the narrow gap 21d is formed along the side edge.

The upper die 21 further has another projection 21e, and the another projection 21e extends in parallel to the projection 21c along the other of the side edges of the cavity 23. The projection 21e also forms a narrow gap 21f over the panel, and separates a dummy cavity 21g from the cavity 23. The cavity 23 is connected through the narrow gap 21f to the dummy cavity 21g, and the dummy cavity 21g is in parallel to the gate 21b.

The molding die 20 is connected to the left side of a center block 24. Though not shown in FIG. 4, another molding die is connected to the right side of the center block 24, and the center block 24 supplies melted synthetic resin to both molding dies. The center block 24 has an upper block 24a and a lower block 24b, which is separable from the upper block 24a.

Plural pots 24c are formed in the lower block 24b, and are arranged along the gate 21b. Plungers 24d are received in the pots 24c, respectively, and are reciprocally moved in the associated pots 24c as indicated by arrow AR1. On the other hand, culls 24e and runners 24f are formed in the upper block 24a. When the upper block 24a and the lower block 24b are assembled together, the culls 24e are located over the pots 24c, respectively, and are connected through the runners 24f to the gate 21b. In this instance, the runners 24f are open to the gate 21b at constant intervals, and melted synthetic resin are uniformly supplied to the entire space of the gate 21b.

Pieces of synthetic resin 25 are respectively put in the pots 24c, and heat is applied to the pieces of synthetic resin 25. When the pieces of synthetic resin 25 are melted, the plungers 24d are upwardly moved, and push the melted synthetic resin through the culls 24e, the runners 24f into the gate 21b, and are in turn injected from the gate 21b through the narrow gap 21d into the cavity 23. The melted synthetic resin is injected through the narrow gap 21d, which is as long as the side edge of the cavity 23, and uniformly flows through the narrow gap 21d into the cavity 23. The melted synthetic resin is not concentrated, and flows into the cavity at a low velocity, because the narrow gap 21d is formed over the side edge of the cavity 23. The melted synthetic resin does not push down the conductive wires 3, and flows into the space over the semiconductor chips 1 as well as the gap therebetween.

The dummy cavity 21g is effective against the wire weep and the voids. If the dummy cavity is not formed in the molding die 20, part of the melted synthetic resin reaches the inner wall opposite to the gate earlier than the remaining melted synthetic resin, and returns toward the gate. Such a reverse flow is causative of turbulence, and the wire weep and the voids tend to occur. However, the molding die 20 has the dummy cavity 21g, and the melted synthetic resin enters the dummy cavity 21g through the narrow gap 21f. No reverse flow takes place. The melted synthetic resin smoothly flows over the cavity 23. In other words, the dummy cavity 23 enhances the smoothness of the flow. Thus, the narrow gap 21d along the side edge and the dummy cavity 21g prevent the package panel 13 from the wire weep and the voids.

The molding work is detailed hereinbelow with reference to FIGS. 6A to 6D. The molding work is corresponding to the step shown in FIG. 2C, and the manufacturer obtains the package panel 13 through the molding work.

Figure 6A:
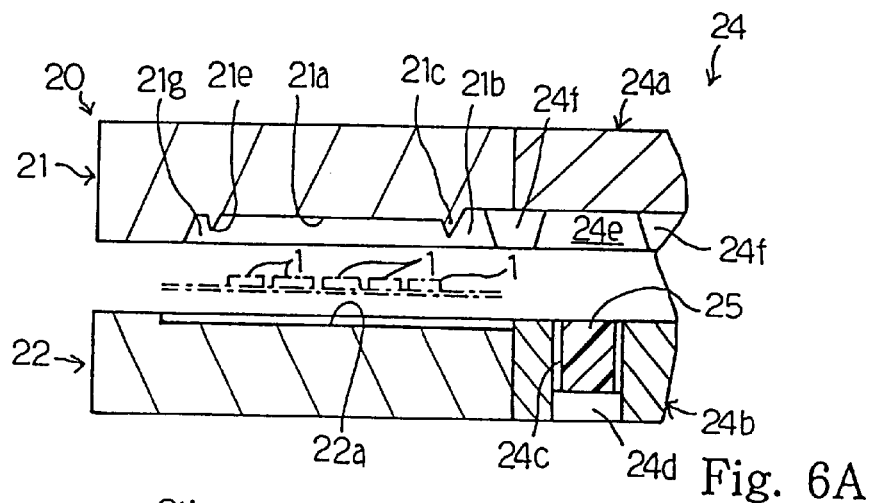
FIGS. 6A to 6D are cross sectional views showing a molding work forming a part of the process according to the present invention.
Figure 6B:
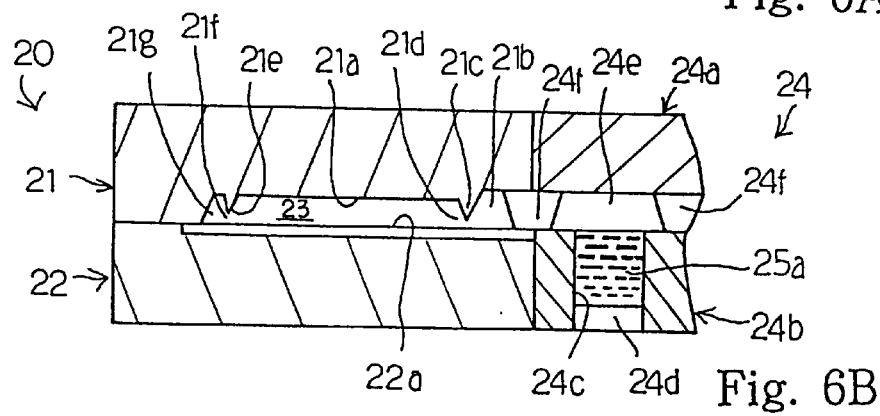
Figure 7A:
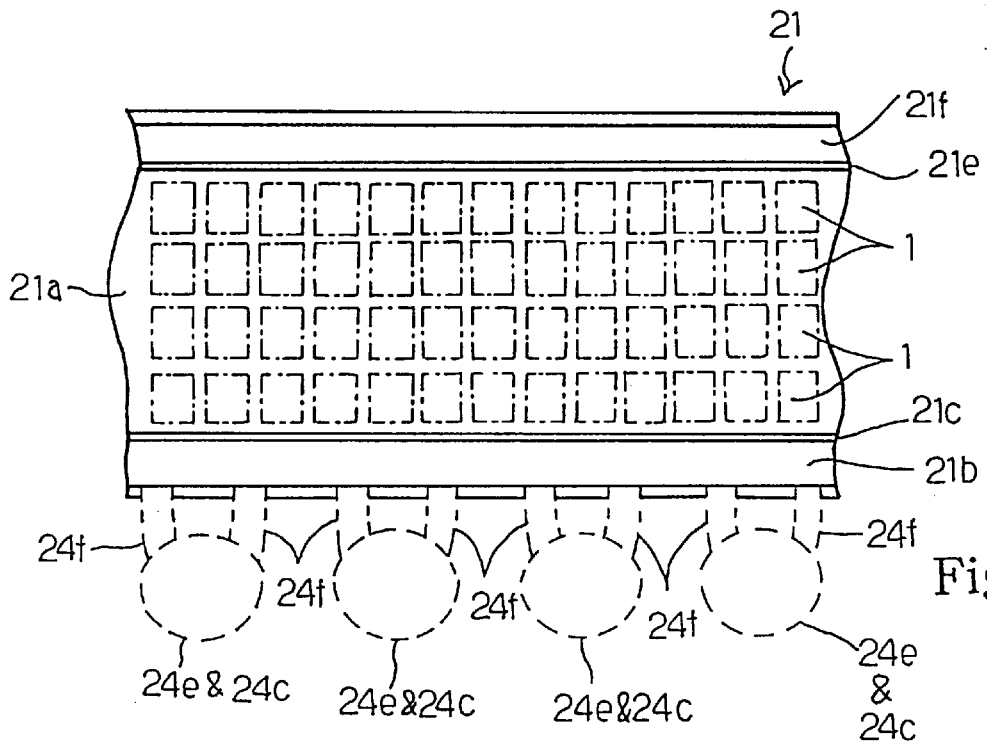
FIGS. 7A and 7B are bottom views showing the inside of the molding die in the molding work.

The upper die and the upper block 21/24a are separated from the lower die and the lower block 22/24b. The semiconductor chips 1 mounted on the panel are inserted into the gap between the upper die 21 and the lower die 22, and the panel is received into the recess 22a. Pieces of synthetic resin 25 or grains of synthetic resin are supplied to the pots 24c as shown in FIG. 6A. In this instance, the semiconductor chips 1 are arranged in four rows between the projections 21c and 21e as shown in FIG. 7A.

The upper die 21 and the lower die 22 are assembled together, and the upper block 24a is concurrently brought into contact with the lower block 24b. The synthetic resin 25 is heated with a heater (not shown), and melted synthetic resin 25a fills the pots 24c a shown in FIG. 6B.

Figure 6C:
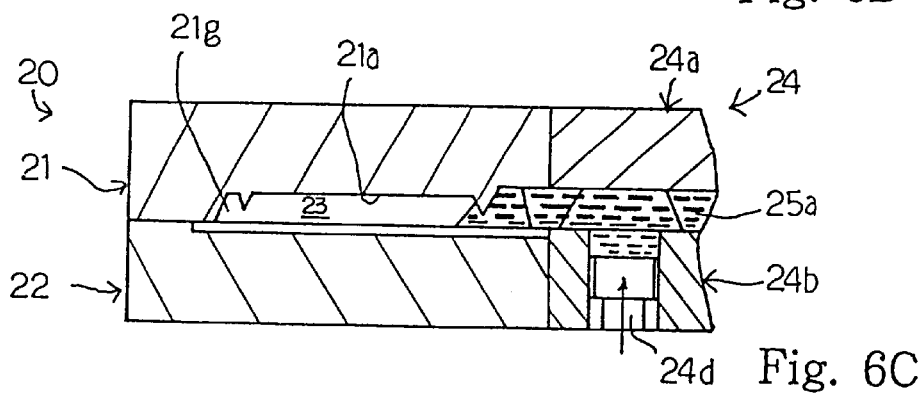
Figure 7B:
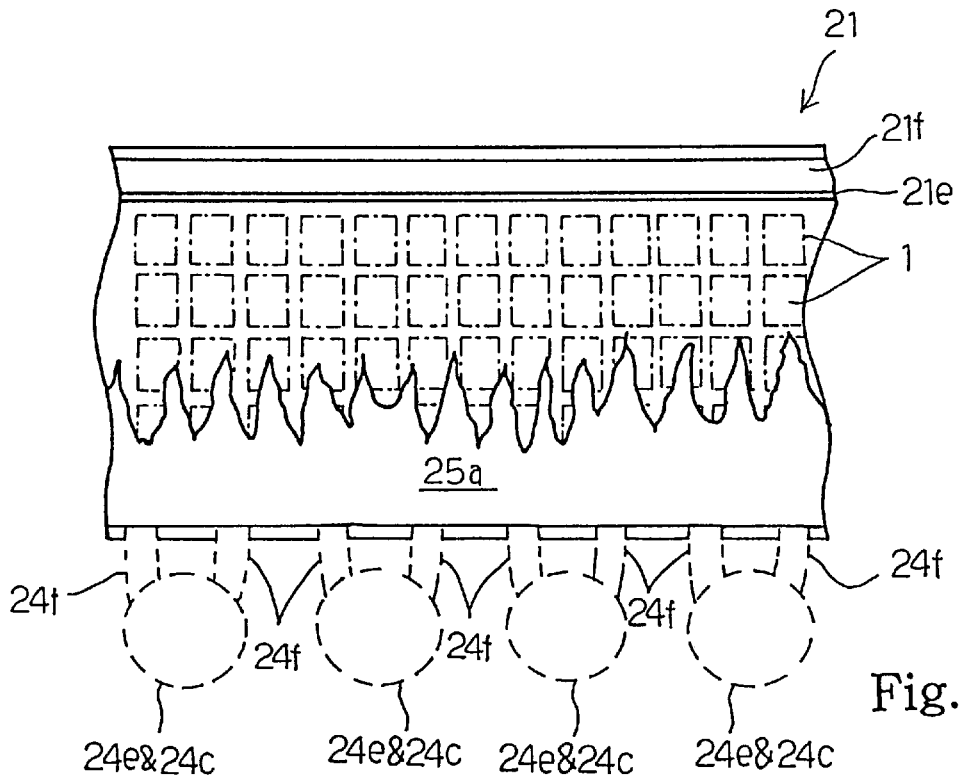

The plungers 24c start the upward motion, and push the melted synthetic resin into the associated culls 24e. The plungers 24c are further moved, and exert pressure to the melted synthetic resin 25a. The melted synthetic resin 25a flows from the culls 24c through the runners 24f, and fills the gate 21b. The plungers 24c further exert the pressure to the melted synthetic resin 25a, and the melted synthetic resin passes through the narrow gap 21d, and flows into the cavity 23 as shown in FIG. 6C. The melted synthetic resin 25a is spread over the entire cavity 23 as shown in FIG. 7B. The narrow gap 21d extends over the row of semiconductor chips 1, and, for this reason, the melted synthetic resin 25a is smoothly spread over the cavity 23 without the wire weep.

Figure 6D:
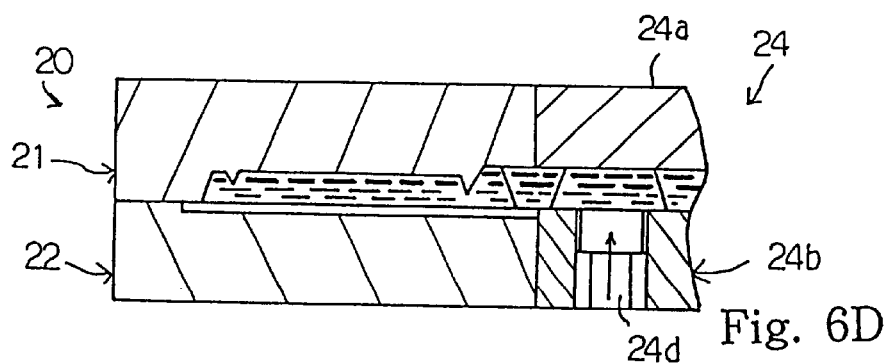

The melted synthetic resin reaches the projection 21e, and flows through the narrow gap 21f into the dummy cavity 21g as shown in FIG. 6D. For this reason, any reverse flow does not occur, and the melted synthetic resin 25a fills the cavity without voids and the wire weep. After the solidification of the synthetic resin, the upper die 21 and the upper block 21/24a are separated from the lower die and the lower block 22/24b, and the package panel 13 is taken out form the molding die 20.

As will be understood from the foregoing description, the semiconductor chips are concurrently molded into the large piece of synthetic resin 12 without voids and the wire weep. Moreover, the molding die 20 is available for semiconductor chips different in size from the semiconductor chips 1 in so far as they are arranged on the same panel. This results in reduction of the production cost.

Although particular embodiments of the present invention have been shown and described, it will be apparent to those skilled in the art that various changes and modifications may be made without departing from the spirit and scope of the present invention.

For example, a laser beam machining and an electric discharge machining may be used in the cutting step. The piece of synthetic resin 2c may be chamfered. The chamfer may be formed as follows. First, shallow grooved are formed along the cutting lines, and, thereafter, the package panel 13 is separated into the dices 15. A part of the shallow groove is left along the edge of the piece of synthetic resin 2c as the chamfer.

The present invention is never limited to the transfer molding. The present invention is applicable to any kind of molding. If the panel has the side lines slightly longer than the end lines, the gate 21b may be formed along one of the end lines.

Different kinds of semiconductor chips may be arranged on the panel so as to concurrently molded in the large piece of synthetic resin.

What is claimed is:

1. A molding die for packaging plural semiconductor chips in a piece of synthetic resin, comprising:
    a cavity for plural semiconductor chips;
    a gate formed along one edge of said cavity, approximately equal in length to said one edge and connected to said one edge; and
    a pot supplying synthetic resin to said gate;
    wherein said gate supplies said synthetic resin from said pot to said cavity through the entire connecting portion between said gate and said one edge of said cavity.

2. The molding die as set forth in claim 1, wherein further said cavity further comprises at least one dummy cavity connected to said cavity by a second gate disposed along a different edge of said cavity than said one edge connected to said gate.

3. The molding die as set forth in claim 2, wherein further said at least one dummy cavity extends along substantially the entire length of said different edge of said cavity.

4. The molding die as set forth in claim 3, wherein further said at least one dummy cavity connected to said cavity along said different edge is disposed opposite to said one edge connected to said gate.

5. The molding die as set forth in claim 2, wherein said dummy cavity connected to said cavity along said different edge is disposed in the same approximate plane as said cavity.

6. The molding die as set forth in claim 1, wherein further said pot for supplying synthetic resin to said gate comprises plural pots, each with at least one plunger, for pressurizing said synthetic resin, and each with at least one passage connecting said pot with said gate.

7. The molding die as set forth in claim 1, wherein further said pot for supplying synthetic resin to said gate comprises at least one heater and one temperature sensor.

8. A mold for plastic encapsulation packaging of a plurality of individual semiconductor circuits electrically connected to at least one conductive circuit frame pattern, comprising:
    at least one rectangular die cavity in the mold, each of said at least one die cavity disposed to contain at least one of the plurality of semiconductor circuits, and at least a portion of an associated circuit frame to which the semiconductor circuit is electrically connected;
    at least one plastic supply line connecting at least one plastic supply reservoir to selected ones of the at least one die cavity; and
    a gate formed along substantially one edge of said rectangular die cavity, wherein the gate supplies the die cavity with plastic from the plastic supply line.

9. The mold as set forth in claim 8, wherein the conductive circuit frame pattern further comprises a printed circuit board.

10. The mold as set forth in claim 8, wherein the conductive circuit frame pattern further comprises an etched metallic pattern on a polyimide tape.

11. The mold as set forth in claim 8, wherein the conductive circuit frame pattern further comprises a mechanically punched metal pattern.

12. The mold as set forth in claim 8, wherein the conductive circuit frame pattern further comprises a ball grid array.

13. The mold as set forth in claim 8, wherein the conductive circuit frame pattern further comprises a pin grid array.

14. The mold as set forth in claim 8, wherein the conductive circuit frame pattern further comprises a peripheral leaded gull wing pattern.

15. The mold as set forth in claim 8, wherein the plastic comprises a synthetic resin.

16. The mold as set forth in claim 8, wherein the plastic comprises a thermosetting resin.

17. The mold as set forth in claim 8, wherein the plastic is supplied from a heated supply reservoir.

18. The mold as set forth in claim 8, wherein the plastic is supplied from a pressurized supply reservoir.

19. The mold as set forth in claim 8, wherein the plastic for a plurality of the die cavities is supplied from a single supply reservoir.

20. The mold as set forth in claim 8, wherein each die cavity in the mold is disposed to contain a plurality of the semiconductor circuits on a single circuit frame having a pattern that connects the semiconductor circuits into one single circuit.

* * * * *